United States Patent [19]
Wada et al.

[11] Patent Number: 5,663,729
[45] Date of Patent: Sep. 2, 1997

[54] CONTROL APPARATUS AND CONTROL METHOD OF AD CONVERTER

[75] Inventors: Yoshimi Wada; Akira Takuma, both of Kawasaki, Japan

[73] Assignee: Fujitsu Limited, Kawasaki, Japan

[21] Appl. No.: 471,532

[22] Filed: Jun. 6, 1995

[30] Foreign Application Priority Data

Sep. 26, 1994 [JP] Japan .................................. 6-229246

[51] Int. Cl.⁶ ................................................ H03M 1/12
[52] U.S. Cl. .................... 341/155; 341/122; 341/123; 341/162
[58] Field of Search ...................... 341/155, 122, 341/123, 142, 162

[56] References Cited

U.S. PATENT DOCUMENTS

| 3,883,863 | 5/1975 | Willard | 340/347 NT |
|---|---|---|---|
| 4,817,040 | 3/1989 | Bodley-Scott | 364/424.04 |
| 5,043,911 | 8/1991 | Rashid | 364/494 |
| 5,081,454 | 1/1992 | Campbell, Jr. et al. | 341/141 |
| 5,260,705 | 11/1993 | Inukai | 341/155 |
| 5,264,850 | 11/1993 | Khorram | 341/155 |

*Primary Examiner*—Jeffrey A. Gaffin
*Assistant Examiner*—Jason L. W. Kost
*Attorney, Agent, or Firm*—Armstrong, Westerman, Hattori, McLeland & Naughton

[57] ABSTRACT

The AD conversion control section of the processor sets the clock generating circuit of the output port alternately to an L-level output condition and an H-level output condition to generate a clock signal. A chip select signal is caused to be output from the chip select circuit of the output port in synchronization with output of the first clock signal by the interruption signal. Furthermore, the bit data output in series bit by bit from the AD converter in synchronization with occurrence of a clock signal is incorporated bit by bit in synchronization with the interruption signal from the input ports to be stored in the register.

21 Claims, 8 Drawing Sheets

FIG. 4A TIMER INTERRUPTION
FIG. 4B CLOCK SIGNAL E1
FIG. 4C CHIP SELECT SIGNAL E2
FIG. 4D AD CONVERSION OUTPUT SIGNAL E3

FIG.5

CONTROL APPARATUS AND CONTROL METHOD OF AD CONVERTER

BACKGROUND OF THE INVENTION

The present invention relates to a control apparatus and a control method of an AD converter of the serial output type which converts an analog signal into a digital signal in synchronization with a clock and outputs the digital signal sequentially bit by bit for each run of conversion. More particularly, the present invention relates to a control apparatus and a control method of an AD converter, which controls the converting operation and incorporation of conversion output of an AD converter by means of port output through control of a processor.

A serial output type AD converter has conventionally been used for processing an analog detection signal from a sensor which detects temperature or humidity exhibiting relatively small fluctuations with time, by incorporation thereof into a microprocessor. The serial output type AD converter converts an analog input signal into, for example, an 8-bit digital signal by supplying a clock signal and a chip select signal from outside bit by bit in compliance with a prescribed bit sequence from the highest level bit to the lowest level bit, and for each run of conversion, one converted bit is outputted as a bit data. A serial bit output from a AD converter is incorporated into a shift register in synchronization with a clock, and at the end of incorporation, 8-bit parallel data is obtained. In order for the AD converter to serially output an 8-bit digital signal, eight runs of converting operation based on the clock signal are required.

When enabling the chip select signal in synchronization with the clock signal, an L-level start bit is first output, and then converting operation takes place in synchronization with the clock signal. Each time, the 8-bit digital signal is sequentially output bit by bit from the higher-level bit. Upon the completion of output of the final bit, the AD converter outputs an H-level stop bit, and then disables the chip select signal to complete the AD converting operation of a cycle. In order to incorporate 8-bit parallel data by the use of a serial output type AD converter, therefore, there are necessary 11 clock signals, as calculated from the sum of the first chip select, the start bit output and the final stop bit.

Control of a serial output type AD converter has conventionally been performed by means of a dedicated hardware circuit. A manner of control comprises, for example, the step of dividing clock pulse of a microsecond order to a processor in a clock generating circuit to generate a clock signal for AD conversion of a millisecond order, which is fixedly supplied to the AD converter. Upon receipt of an instruction for AD conversion from the processor, a flip-flop of an output port is set in synchronization with this clock signal and a chip select signal is enabled. This causes the AD converter to begin converting operation in synchronization with the clock signal. The clock signal from the clock generating circuit is given also to an input port of the processor, and bit output taking place between the start bit and the stop bit is incorporated into a register to convert into parallel data.

One of the favorable merits of the serial output type AD converter is a low cost. A parallel output type AD converter commonly used can incorporate 8-bit parallel data with a single run of converting operation, and ensures high-accuracy and high-speed converting operation. However, the parallel type AD converter, requiring a high cost, is not suitable for an apparatus not requiring a high conversion speed or a high accuracy. A usual AD converter is provided with a sample hold circuit to sample-hold an analog signal and then convert it into a digital signal by the AD converter. However, temperature or humidity varies little during the time of AD conversion taking place in a millisecond order, rarely requiring sample holding. Therefore, when converting a detection signal from a sensor of temperature or humidity showing slightest fluctuations with time, a favorable merit of further reducing the cost is available by eliminating the sample hold circuit and directly making an input into a serial output type AD converter for conversion.

However, control of such a conventional serial output type AD converter had a problem in that, because control is fixedly performed by the hardware circuit in all cases, the hardware circuit increases according as the load on the processor is reduced, thus resulting in an increased cost. Much time and labor are required for circuit design to achieve: clock frequency or clock width cannot easily be changed in match with properties of the analog sensor. Malfunction of the AD converter prevents normal output of the start bit or the stop bit. It is difficult to identify such a malfunction with the hardware circuit from cost considerations because a complicated circuit configuration is required. A resulting problem is that abnormal data caused by the malfunction of the AD converter is directly incorporated into the processor, thus leading to abnormal control by the processor and a lack of reliability. In process control of temperature, for example, control of the heater by the processor without recognizing abnormal data of the sensor caused by malfunction of the AD converter may cause abnormal heating.

SUMMARY OF THE INVENTION

According to the present invention, there are provided a control apparatus and a control method of a serial output type AD converter which permit cost reduction as well as a checkup of a malfunction or a change in operational conditions, by controlling AD converting operation by the processor.

The present invention covers a serial output type AD converter. The serial output type AD converter converts an analog signal entered from a sensor, in a state with a valid chip select signal, into a bit in a digital signal of a prescribed number of bits every time it receives a clock signal in compliance with a prescribed bit sequence, and outputs one bit converted for each run of conversion as a bit data.

The output port of the processor is provided with a clock generating circuit which outputs a clock signal to be supplied to the AD converter, and a chip select generating circuit which prepares a chip select signal to be supplied to the AD converter. The processor is provided with a register, an interruption timer and an AD conversion control section. The register stores digital signals converted by the AD converter. The interruption timer generates interruption signals at prescribed intervals over a specified control period of the AD converter.

The AD conversion control section sets the clock generating circuit alternately to an L-level output state and an H-level output state each time an interruption signal is received from the interruption timer to generate a clock signal. The AD conversion control section causes the chip select generating circuit to output a chip select signal in synchronization with output of the first clock signal caused by the interruption signal. The AD conversion control section incorporates the bit data output from the AD converter in synchronization with generation of the clock signal from the input port bit by bit in synchronization with the interruption signal for storage.

The serial output type AD converter outputs an L-level start bit preceding the top bit of bit data synchronizing with a clock signal E1 and outputs an H-level stop bit, different from the start bit, following the final bit. Prior to reading the bit data into the register, therefore, the AD conversion control section determines whether or not the start bit to be output by the AD converter is on a specified level, and if not, determines it as an error. For the purpose of making an error determination, it is desirable to determine whether or not the start bit is on the specified level through retries of outputting again the clock signal upon error determination of the start bit, and to make an error determination only when the specified level is not met even after multiple runs of retry. Upon the completion of read-in of the bit data into the register, the AD conversion control section determines whether or not the stop bit output by the AD converter is on a specified level, and if not, determines it as an error. For the purpose of making an error determination in this case also, it is desirable to determine whether or not the stop bit is on the specified level through retries of outputting again the clock signal upon error determination of the stop bit, and to make an error determination only when the specified level is not met even after multiple runs of retry.

For the incorporation of bit data by the AD conversion control section, the bit data is incorporated into the register after setting an L-level output state in the clock generating circuit by means of an interruption signal. This may be accomplished by incorporating the bit data into the register after setting an H-level output state in the clock register by means of an interruption signal.

The interruption timer can freely make the timer period variable in response to an analog signal to be converted. It is therefore possible to change the timer period of the interruption timer in the middle of AD converting operation of the AD converter.

Flip-flop circuits set or reset in compliance with an instruction from the processor based on an interruption signal are used as the clock generating circuit and the chip select generating circuit provided on the output port of the processor. Furthermore, the serial output type AD converter converts a detection signal output from an analog sensor of temperature or humidity into a digital signal.

The present invention provides a control method of a serial output type AD converter.

The control method comprises the steps of:

I. generating an interruption signal at prescribed time intervals throughout a control period of an AD converter;

II. preparing and outputting to the AD converter a clock signal by setting alternately an L-level output state and an H-level output state each time an interruption signal is received;

III. outputting a chip select signal to the AD converter in synchronization with the first clock signal; and IV. incorporating bit data output from the AD converter sequentially bit by bit in synchronization with generation of the clock signal by the interruption signal, and storing said bit data as parallel data, Details of this control method are the same as those of the above-mentioned apparatus configuration.

According to the control apparatus and the control method of an AD converter of the present invention as described above, all operations necessary for conversion by a serial output type AD converter including a clock signal, a chip select signal and storage of bit output to a register are accomplished by an AD conversion control section serving as firmware on the basis of an interruption signal from an interruption timer provided in a processor. Only a serial output type AD converter and external circuits are required for the hardware circuit external to the processor, and this permits minimization of the circuit configuration, thus resulting in a minimum circuit scale and a reduced cost.

The period of the clock signal and the clock width determining the AD converting operations can easily be achieved by software processing comprising changing the set period of the interruption timer of the processor, not requiring a change in the circuit design.

Furthermore, by having a check routine of the start bit upon starting conversion and the stop bit upon discontinuing conversion of the AD converter, it is possible to detect malfunction of the AD converter without fail, avoid processing of converted data upon occurrence of malfunction as valid data without fail, and improve reliability of AD conversion.

In addition, when determining an error of the start bit or the stop bit, it is possible to prevent determination of a recoverable error caused by noise, for example, as a hardware error and thus to improve reliability of error determination by performing retry operation for restoring normal operation through multiple runs of output of a clock.

The above and other objects, features, and advantages of the present invention will become more apparent from the following detailed description with reference to the drawings.

DETAILED DESCRIPTION OF THE PREFERRED EMBODIMENTS

Figure 1:
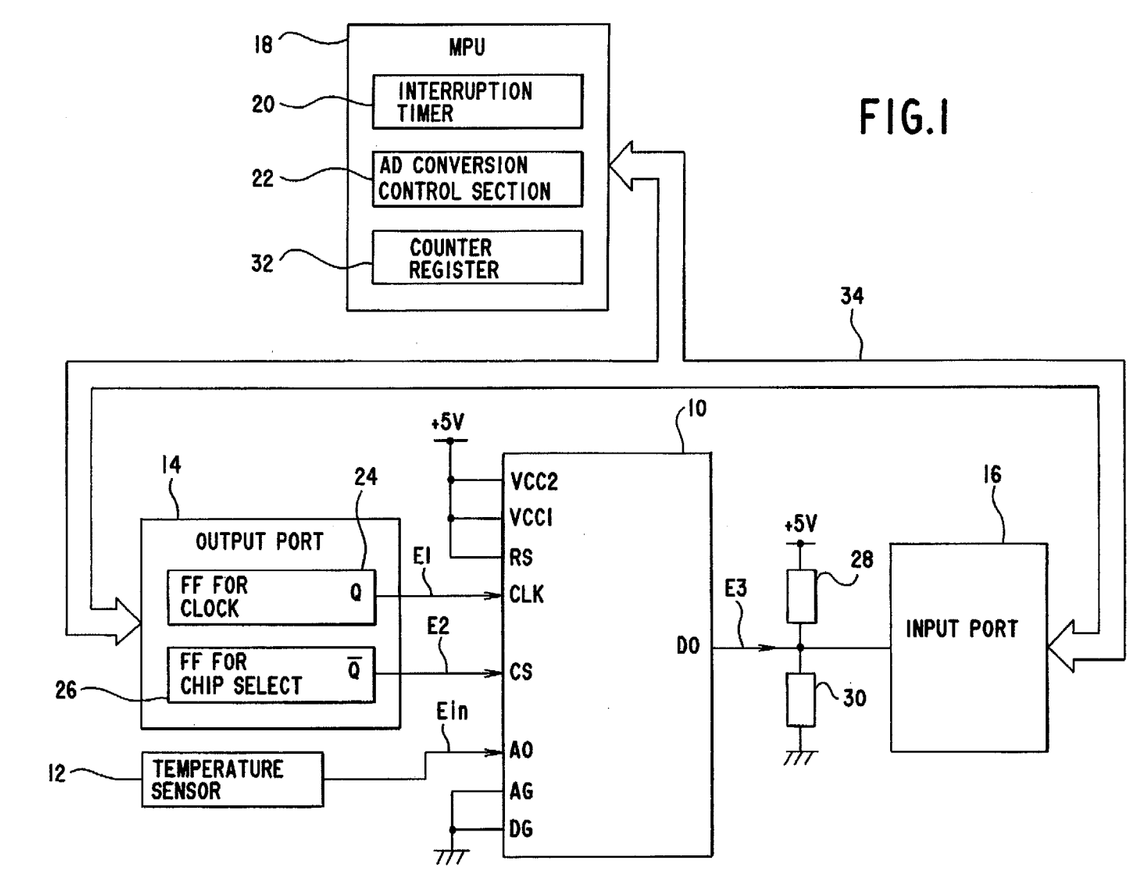
FIG. 1 is a block diagram of an embodiment of the present invention.

FIG. 1 is a block diagram of an embodiment of the present invention. The AD converter 10 to be controlled in the present invention is a serial output type AD converter such as Fujitsu's MB4052M. The AD converter 10 has a clock input terminal CLK, a chip select input terminal CS, an analog signal input terminal AO, and a digital signal bit output terminal DO. Power supply terminals VCC1 and VCC2 and a reset terminal RS are connected to a +5 V power supply line. Ground terminals AG and DG are connected to a ground line. In this embodiment, a signal line from a temperature sensor 12 is connected to the analog input terminal AO of the AD converter 10 to enter an analog temperature detection signal Ein detected by the temperature sensor 12. The temperature sensor 12 is used, for example, for temperature detection of a photosensitive drum of a laser printer. For the purpose of performing AD conversion control of the AD converter 10, a microprocessor unit (hereinafter referred to as "MPU") 18 is provided. MPU 18 has an output port 14 and an input port 16 which are connected with buses 34.

MPU 18 is provided with an interruption timer 20, an AD conversion control section 22 and a counter register 32. The interruption timer 20 and the AD conversion control section 22 serve as functions under program control. A general-purpose counter register provided as a hardware component is used as the counter register 32. The output port 14 of MPU 18 is provided with a flip-flop 24 for clock operating as a clock generating circuit and a flip-flop 26 for chip select operating as a chip select generating circuit. A clock signal E1 from the flip-flop 24 for clock is output to the clock input terminal CLK of the AD converter 10. A chip select signal E2 from the flip-flop 26 for chip select is output to the chip select input terminal CS of the AD converter 10. An output line from the bit output terminal DO of the AD converter 10 biased to a voltage level of a prescribed logical level H by voltage divided by resistances 28 and 30. The interruption timer 20 provided in MPU 18 generates an interruption signal at a predetermined interruption period of, for example, 10 ms upon converting operation of the AD converter 10.

The AD conversion control section 22 set/reset-controls the flip-flop 24 for clock of the output port 14 on the basis of the interruption signal from the interruption timer 20 to generate the clock signal E1. More specifically, set and reset of the flip-flop 24 for clock are alternately repeated each time the interruption signal is received. The flip-flop 26 for chip select performs setting operation in synchronization with output of the first clock signal in the flip-flop 24 for clock to bring the chip select signal E2 to L-level showing the enable state. While the chip select E2 is on L-level showing the enable state, the AD converter 10 conducts operation of converting an analog temperature detection signal from a temperature sensor 12 into an 8-bit digital data in synchronization with the clock signal E1.

In this converting operation, at a timing of the first clock signal E1 with the chip select signal E2 on L-level, there is output a start bit which brings a bit output signal E3 to L-level irrespective of the analog input. Upon the completion of output of the single-bit signals E3 corresponding to eight bits following the start bit, there is output a stop bit which brings the single-bit signal E3 from the bit output terminal DO to H-level irrespective of the analog input.

The AD conversion control section 22 provided in MPU 18 controls generation of the clock signal E1 and the chip select signal E2, and at the same time, incorporates single-bit signals E3 output from the bit output terminal DO of the AD converter 10 in synchronization with the clock signal sequentially from the input port 16, and stores these bits into the counter register 32. The AD conversion control section 22, operating in compliance with a machine clock of the microsecond order, checks up whether or not the start bit output by the AD converter 10 prior to converting operation is correctly on L-level, and whether or not the stop bit output after the completion of the converting operation is properly on H-level. If the start bit remains on H-level as a result of malfunction, there is performed a retry operation comprising repeating multiple times output of the clock signal E1 in synchronization with an interruption signal of the interruption timer 20, and if the start bit does not return to the proper L-level in the meantime, it is determined to be a framing error: then the error is processed or an error notice is given to a higher-level controller. When the stop bit becomes abnormal, being on L-level, as a result of malfunction of the AD converter 10 in a state in which the eight-bit data is stored in the counter register 32 after the end of AD conversion, retry operation is similarly conducted of outputting the clock signal E1 in synchronization with the interruption signal of the interruption timer 20. When the normal H-level is not restored for the stop bit even after such retry, the eight-bit data stored in the counter register 32 is invalidated not to use it for temperature control, for example. This is then subjected to an alarm processing as a framing error of the AD converter, and as required, an error notice is given to a higher-level controller.

Figure 2:
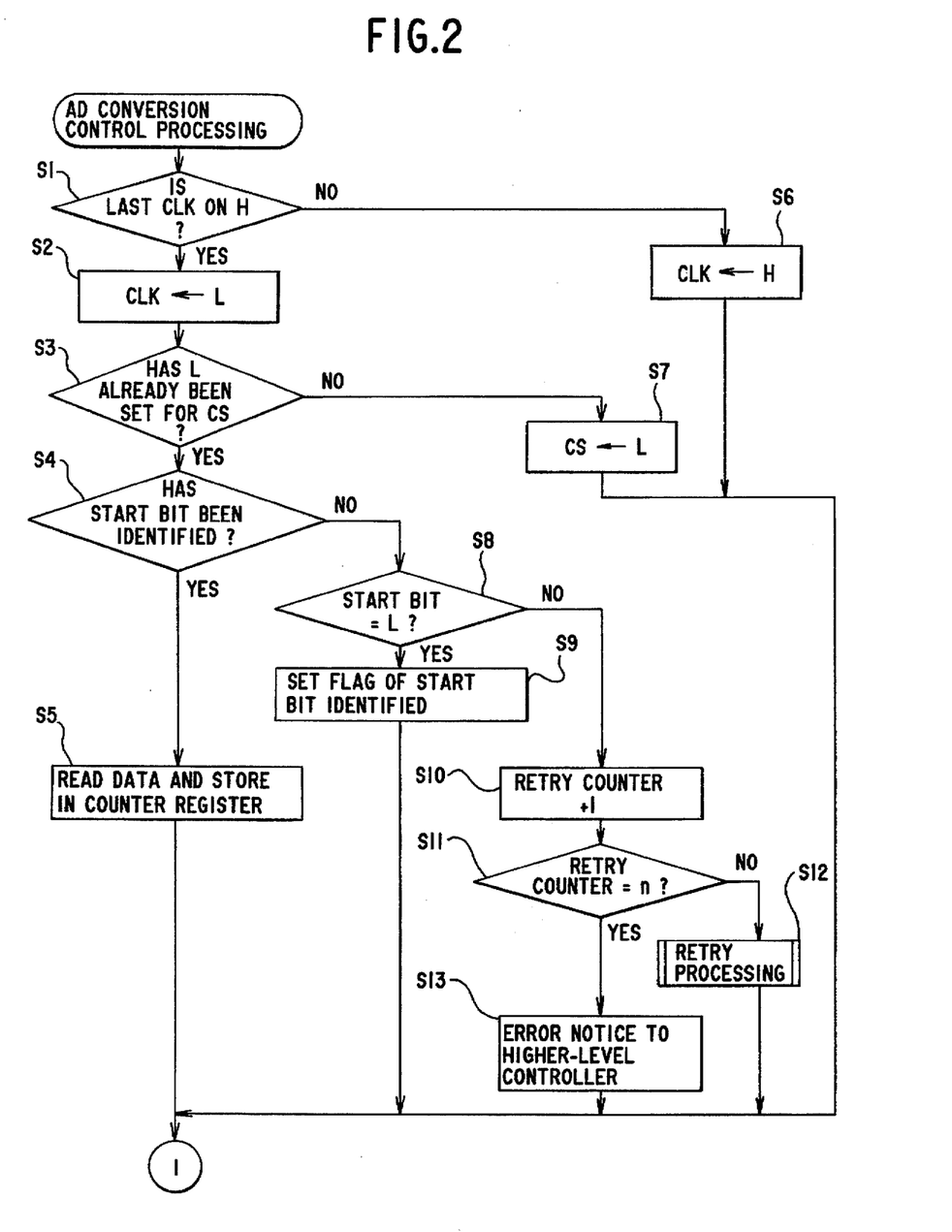
FIG. 2 is a flowchart of AD conversion control in the present invention in synchronization with bringing-down of clock.
Figure 3:
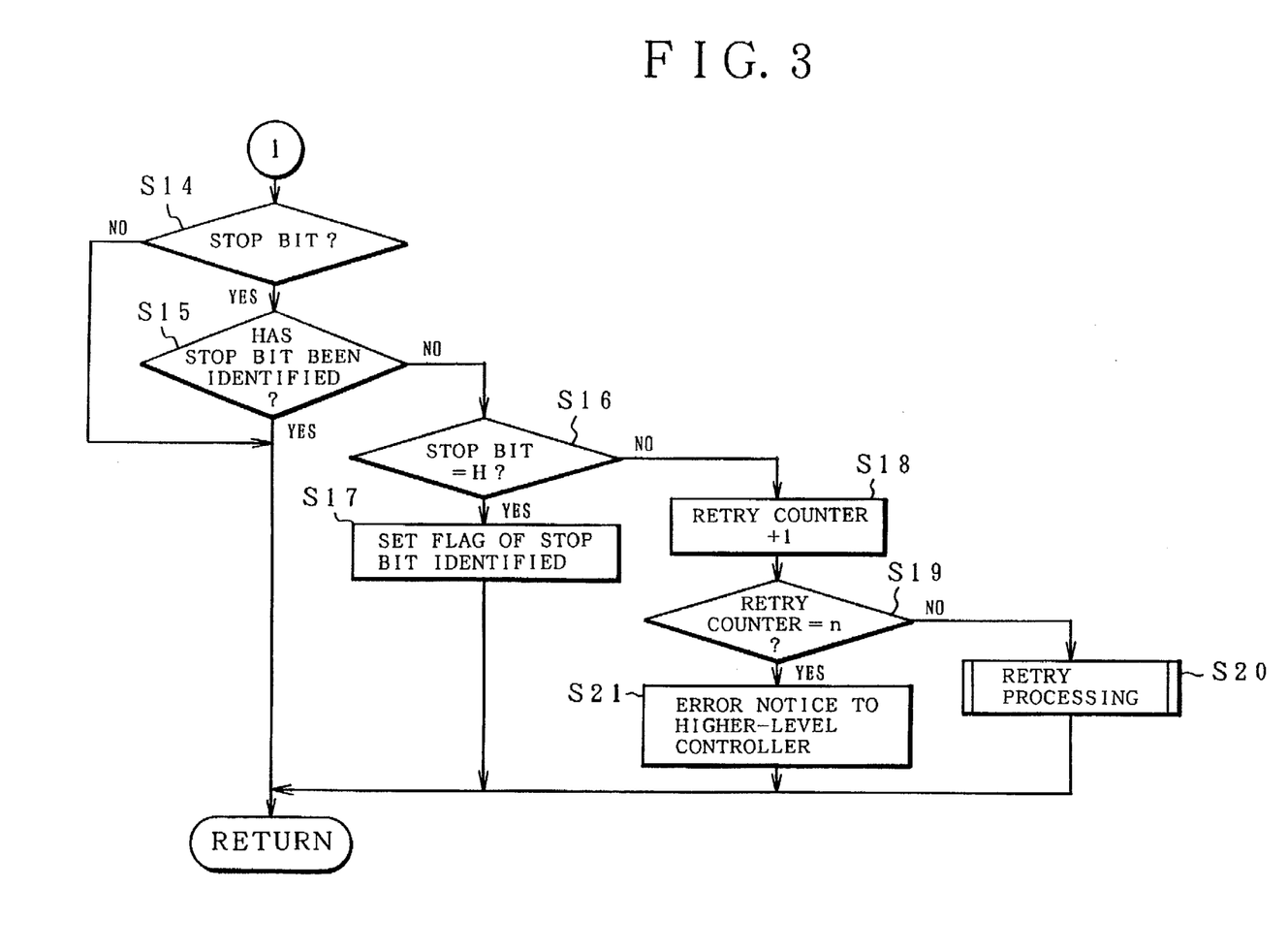
FIG. 3 is a flowchart of AD conversion in the present invention following FIG. 2.

The flowcharts shown in FIGS. 2 and 3 represent control processing by the AD conversion control section 22 provided in MPU 18 shown in FIG. 1. In MPU 18, when a request for incorporating temperature data from the AD converter 10 occurs, the interruption timer 20 operates for a certain conversion control period, generates interruption signals at intervals of, for example, 10 ms, for each occurrence of this interruption signal, and the AD conversion processing shown in FIGS. 2 and 3 are started up. The AD conversion control processing begins with checkup as to whether or not the last clock is on H-level, at step S1 shown in FIG. 2. Because the last clock is initially on L-level, processing goes to step S6 where H-level is set for the clock CLK. More specifically, the flip-flop 24 for clock of the output port 14 is set to bring the clock signal E1 to H-level. When the clock is set at H-level at step S6, it is checked whether or not the timing of the stop bit is met, and since this not the timing for the stop bit, the processing at this step comes to an end, returning to the step of waiting for the next interruption.

Upon starting up by the second interruption signal, since the last clock is on H-level at step S1, processing proceeds to step S2 where the clock is set to L-level, i.e., the flip-flop 24 for clock of the output port 14 is reset to bring the clock signal E1 down to L-level. Then step S3 is to check whether or not chip select has already been set to L-level. In the initial state, the chip select is on H-level. Processing therefore proceeds to step S7 where L-level is set for the chip select to achieve an enable state. That is, the flip-flop 26 for chip select of the output port 14 is set to bring the chip select signal E2 down to L-level. After bringing the chip select to L-level at step S7, processing goes through step S14 shown in FIG. 3 with no further processing to return to waiting for interruption.

Upon receipt of the third interruption signal from the interruption timer 20, processing goes to step 6, since the last clock is on L-level at step S1, the clock is brought up to H-level, returning to waiting for the next interruption. The AD converter 10 brought into operating state as a result of the chip select signal E2 becoming valid (L-level) in synchronization with rise-up of the clock signal E1 to H-level upon receipt of this third interruption signal switches over the bit output terminal E from non-operating H-level state to L-level output representing the start bit. Now, the operations up to the third occurrence of this timer interruption are described below with reference to the timing chart shown in FIG. 4.

Figure 4A:
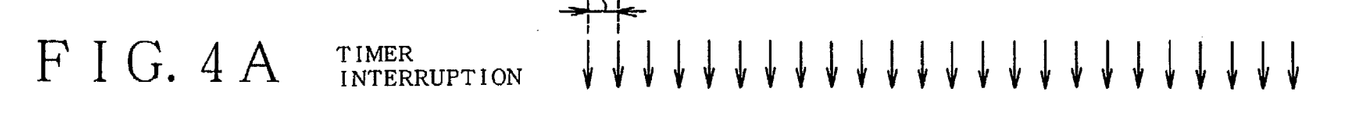
FIGS. 4A to 4D are timing charts of AD conversion control in the present invention in synchronization with bringing-down of clock shown in FIG. 1.
Figure 4B:
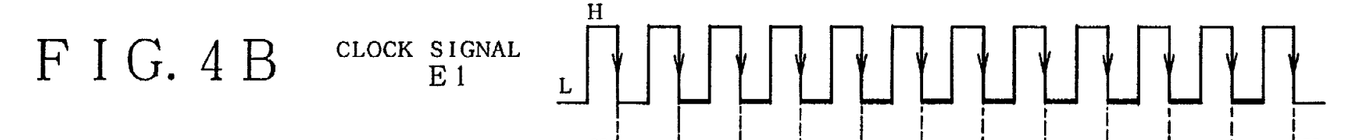

Upon the first timer interruption as shown in FIG. 4A, the clock signal E1 shown in FIG. 4B rises up to H-level, and is brought down to L-level upon the second timer interruption. Upon the third timer interruption, the clock signal E1 is brought up to H-level, and the AD converter 10 coming into operating state by the chip select signal E2 on L-level then outputs the start bit brought down to L-level as the AD conversion output signal E3 shown in FIG. 4D.

Referring again to FIG. 2, upon the fourth interruption signal after the AD converter 10 outputs the start bit, because of the last clock being on H-level, processing goes to step S2, where the clock is brought to L-level. At step S3, since the chip select has already been set at L-level, it is checked up if the start bit has been identified or not at step S4. This incorporation is accomplished at any timing within the section represented by the thick solid line after it is brought down to L-level. As the start bit is not as yet identified, processing shifts to step S8 where it is checked whether or not the read-in start bit is on a proper level. When it is properly on L-level, the flag representing an identified start bit is set at step S9, returning then to waiting for the next interruption.

On the other hand, when the start bit is on H-level, not correctly on L-level as a result of malfunction of the AD converter 10, the retry counter is set at +1 at step S10, and at step S11, it is checked whether or not a predetermined value n has been reached by the retry counter, continuing to carry out retry processing at step S12 until n is reached. As the start bit is abnormal, the retry processing at step S12 is to generate the clock signal E1 n-times without performing incorporation of bit data into the counter register 32. More specifically, at step S12, the single-bit output signal E3 of the AD converter 10 is not incorporated into the counter register 32, returning to the step of waiting for the next interruption. This processing is repeated until the start bit is properly brought down to the L-level at step S8. If the start bit cannot be correctly brought to L-level even after repetition of retry processing n-times, processing shifts from step S11 to step S13 where the status is judged to be a framing error of the AD converter 10, and an error notice is, for example, given to a higher-level apparatus. In normal operation, a start bit properly on L-level is received from the AD converter 10, and the flag representing identification of the start bit is set at step S9, returning to waiting for the next interruption.

Figure 4C:
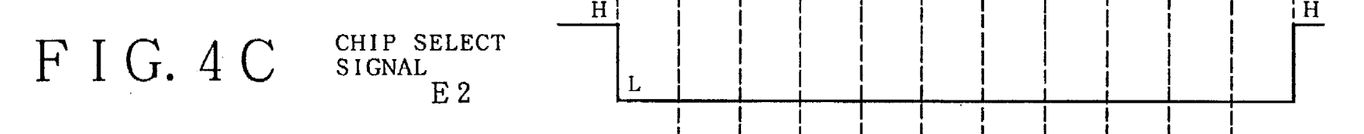
Figure 4D:
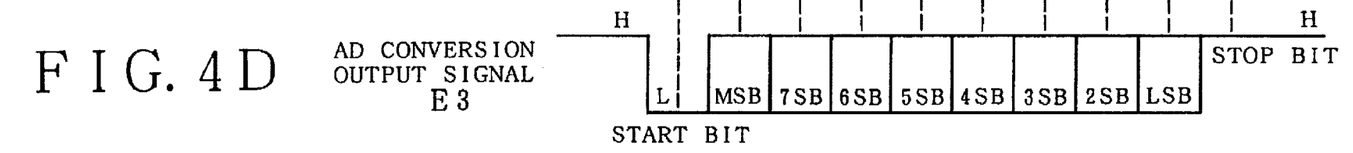

Then, after setting the clock on H-level upon the fifth timer interruption, as shown in FIG. 4D, the AD converter 10 outputs the AD conversion output signal (single-bit output signal) E3 including all bits ranging from the highest-level master serial bit (MSB) up to the lowest-level last serial bit (LSB) at intervals of the clock period. In the processing shown in FIG. 2, after setting and bringing down the clock signal to L-level in response to the timer interruption, bit data of the AD conversion output signal E3 is read in and stored in the counter register 32. More particularly, at an operating timing caused by the machine clock within the section represented by the thick solid line from bringing down of the clock signal E1 to L-level to the next rise-up to H-level, storage of bit data for eight bits from the master serial bit to the last serial bit is sequentially performed.

Upon the completion of storage of the last bit (LSB) from the AD converter into the counter register 32, the output signal E3 of the AD converter is fixed at H-level indicating the stop bit. This stop bit is checked up by the routine including the steps S14 to S21 shown in FIG. 3. First at step S14, output timing of the stop bit is determined, and then at step S15, it is checked whether or not the stop bit has already been identified. Since the stop bit is not initially identified, the routine proceeds to step S16, where it is checked whether or not the stop bit is properly set at H-level. If it is properly on H-level, the flag representing stop bit identification is set at step S17, and the next timer interruption is waited for. The timer interruption following identification of the stop bit being properly on H-level causes setting of the clock signal E1 shown in FIG. 4A at L-level, and in synchronization with this, the chip select signal E2 shown in FIG. 4C is set at H-level representing disable condition, thus completing the converting operations of the AD converter 10.

When the stop bit remains on L-level as a result of malfunction of the AD converter 10, on the other hand, the count on the retry counter is increased by one at step S18, and it is checked whether or not the prescribed value n has been reached at step S19, thus continuing retry processing until the prescribed value n is reached. This retry processing of the stop bit is a processing for retaining conversion data stored in the counter register 32 of MPU 18, without passing such data to a temperature control section, for example, requiring conversion data. If the stop bit is properly brought up to H-level before the number of clock occurrences as resulting from the retry processing reaches n, the data stored in the counter register 32 is delivered at this moment as valid data to the temperature control section. When the stop bit remains on L-level even after the retry processing up to the time point when n has been reached by the indication of the retry counter, on the other hand, this status is determined as a framing error of the AD converter 10: an error notice is given to a higher-level controller at step S21, and at the same time, the data stored in the counter register 32 is invalidated to disable the use thereof in temperature control.

Figure 5:
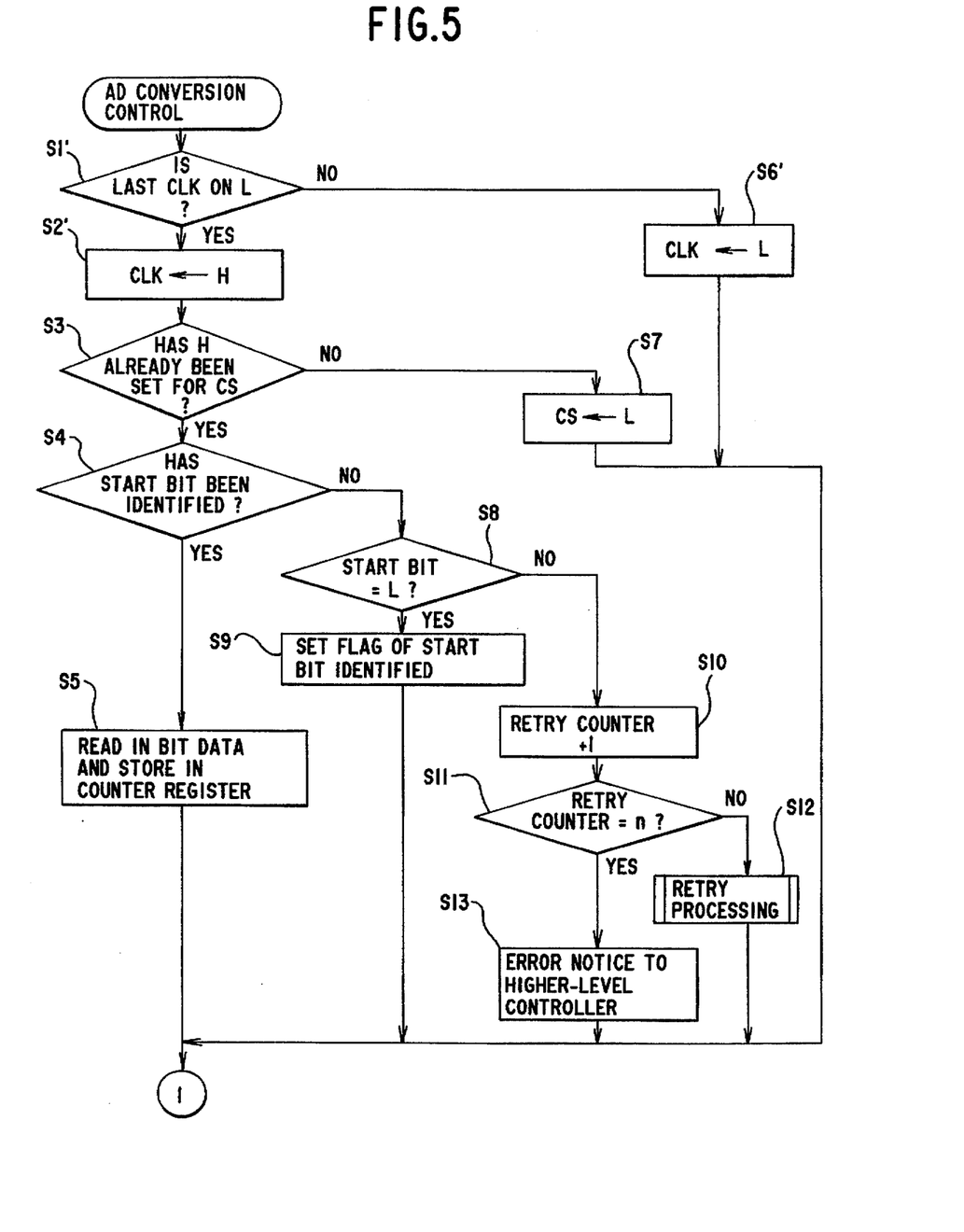
FIG. 5 is a flowchart of AD conversion control in the present invention in synchronization with bringing-up of clock.
Figure 6A:
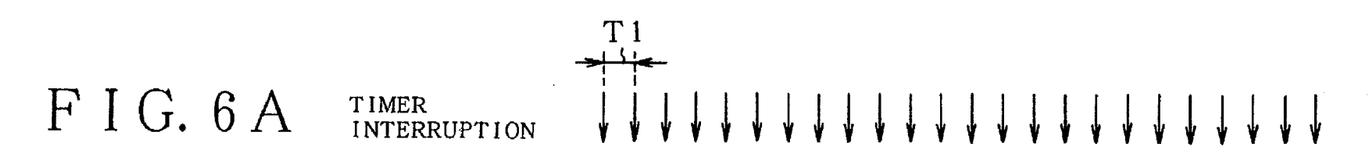
FIGS. 6A to 6D are timing charts of AD conversion control in the present invention in synchronization with bringing-up of clock.
Figure 6B:
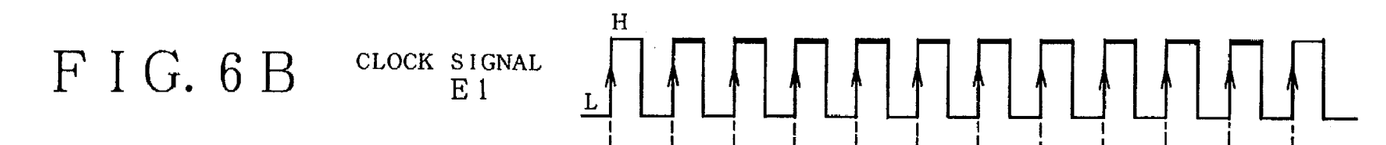
Figure 6C:
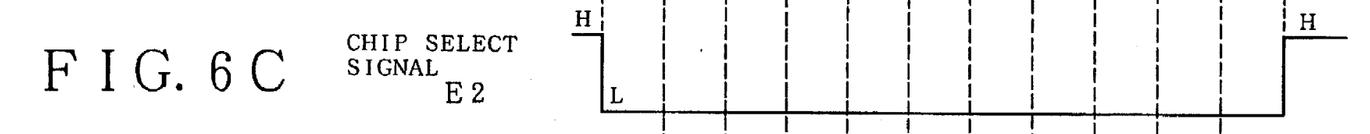
Figure 6D:
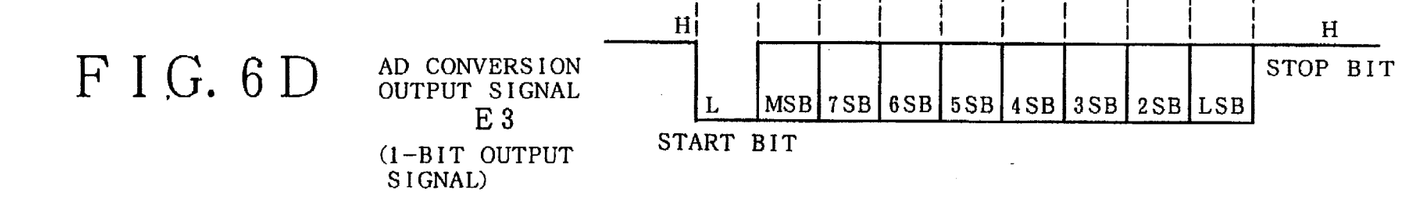
Figures 7A, 7B:
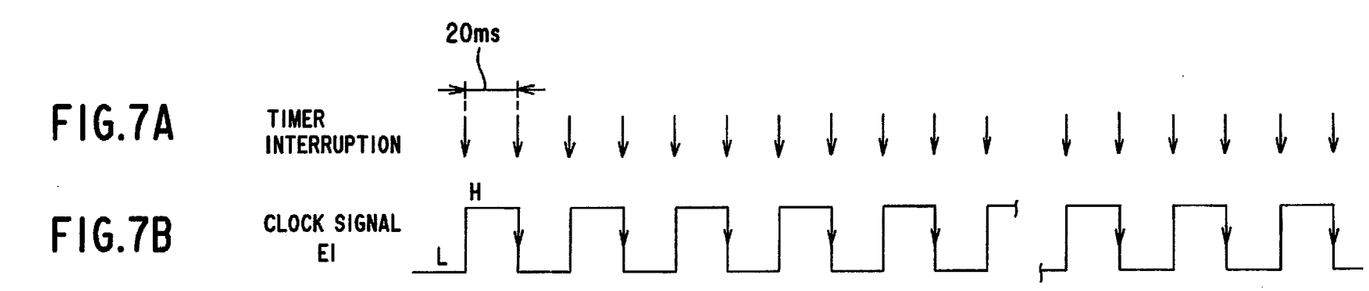
FIGS. 7A to 7D are timing charts with a doubled period of the interruption timer.
Figure 7C:
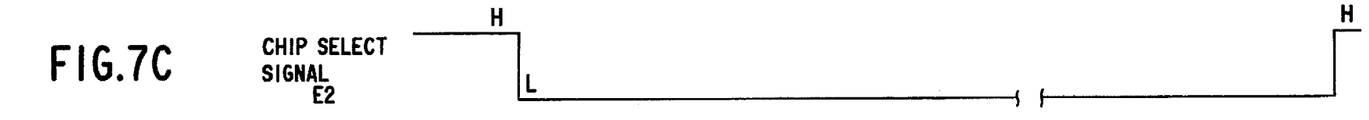
Figure 7D:
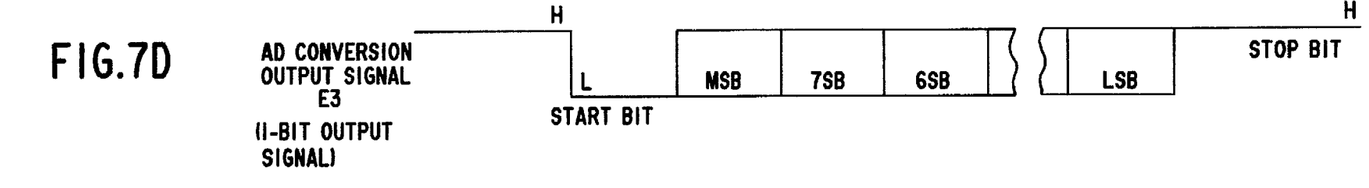

The flowchart shown in FIG. 5 covers another embodiment of AD conversion control processing in the present invention. This embodiment comprises the steps of setting H-level for the clock by the AD conversion control section 22, then checking up the chip select signal, the start bit and the stop bit, and incorporating bit data. More particularly, in synchronization with bringing-up of the clock signal E1 of FIG. 6B to H-level as caused by timer interruption of FIG. 6A, there are accomplished an enable condition (setting to L-level) of the chip select signal E2 of FIG. 6C, and incorporation of the start bit, the bits from the master serial bit (MSB) to the last serial bit (LSB) and the stop bit of the AD conversion output signal E3 of FIG. 6D. Because AD conversion processing is carried out with bringing-up of the clock signal to H-level upon timer interruption as described above, if the last clock is on L-level at step S1, the clock is brought up to H-level at step S2, to perform step S3 and subsequent series of control processing. When the last clock is on H-level at step S1, in contrast, processing shifts to step S6 where the clock is brought down to L-level, going to waiting for the next interruption without performing further control processing.

As compared with the conversion processing after setting L-level of the clock as shown in FIG. 2, at step S1 in FIG. 1, it is checked up whether or not the last clock is on H-level, whereas at step S1 in FIG. 5, it is checked up whether or not the last clock is on L-level. If the last clock is on H-level as shown in FIG. 2, the clock is brought down to L-level at step S2 to perform step S3 and subsequent conversion processing. In the case shown in FIG. 5, in contrast, if the last clock is on L-level, the clock is brought up to H-level at step S2 to carry out step S3 and subsequent conversion control processing. Consequently, in the processing shown in FIG. 2, incorporation of the bit data of step S5 into the counter register 32 of step S5 is accomplished at the timing between bringing-down and bringing-up of the clock. In the processing shown in FIG. 5, in contrast, incorporation of the bit data into the counter register 32 at step S5 is accomplished at any operational timing by the machine clock within the range indicated by a thick solid line shown in FIG. 6B from bringing-up of the clock signal to H-level up to the next bringing-down to L-level.

The timing charts of FIGS. 7A to 7D cover an embodiment in which the interruption period of the interruption timer 20 provided in MPU 18 is changed to 20 ms, twice as long, with reference to the operations shown in the flowchart of FIG. 2 in which chip select and data incorporation are performed after bringing down the clock to L-level.

In the present invention, as described above, an arbitrary conversion speed of the AD converter can be freely set by only changing the timer period of the interruption timer 20 provided in MPU 18. When MPU 18 bears a heavy load of programs processed in addition to AD conversion control, for example, MPU 18 can be assigned to processing of programs other than AD conversion control by increasing the interruption period of the interruption timer 20. The interruption timer period can be expanded of course within a range accommodated in the converting operation time not affected by temperature fluctuation with time of the temperature sensor 12. On the contrary, an interruption period further shorter than the timer interruption period T1=10 ms shown in FIG. 6A may be set to reduce an error corresponding to variations with time of the analog signal.

In addition, when analog signals show a change with time between output of the first master serial bit (MSB) and output of the last serial bit (LSB) under the effect of changes with time in analog signals in AD conversion for each run of bit output during the incorporation period of eight-bit data by the AD converter 10, multiple runs of AD conversion control may be performed to use average data over data derived from multiple runs as obtained from the counter register 32.

The timing charts of FIGS. 8A to 8D cover further another embodiment of AD conversion control of the present invention. This embodiment is characterized in that the interruption period of the interruption timer 20 is changed in the middle of AD conversion from 10 ms to 20 ms. Chip select control and incorporation of output signals are in the same manner as in the case shown in FIG. 2 in which these operations are accomplished at a timing when the clock signal has been set to L-level.

Figure 8A:
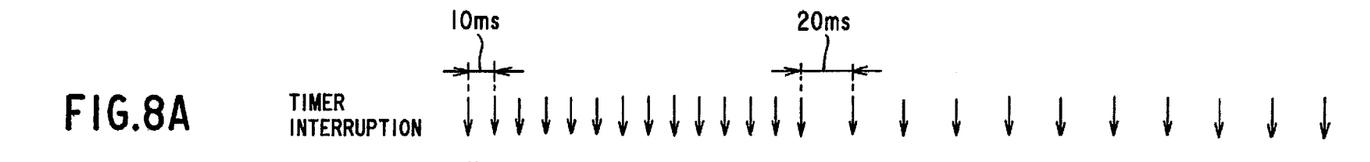
FIGS. 8A to 8D are timing charts with the period of the interruption timer changed in the middle of AD converting operation.
Figure 8B:
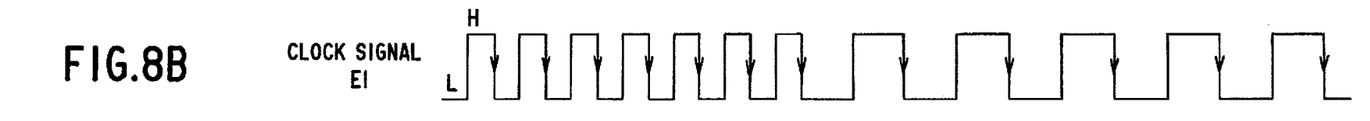
Figure 8C:
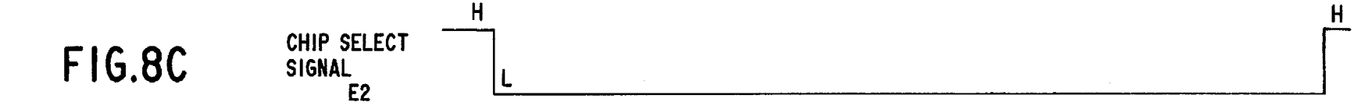
Figure 8D:
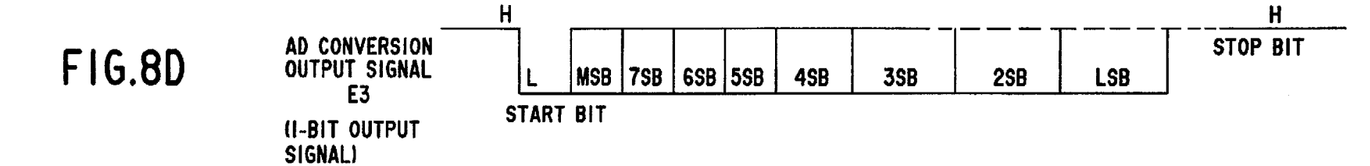

The timer interruption in FIG. 8A, which is initially performed at intervals of 10 ms is switched over to 20 ms, a period twice as long, in the middle of processing. As a result, the AD conversion output signal E3 is output by the converting operation based on the clock signal E1 caused by timer interruption of 10 ms for the bits ranging from the master serial bit MSB to the fifth serial bit 5SB. For the next fourth serial bit 4SB and the subsequent bits, the converting operation is changed into one based on the clock signal for which the period is enlarged to twice as large resulting from timer interruption of 20 ms. Consequently, the resolution of AD conversion with time varies between higher-level and lower-level bits.

According to the present invention, as described above, all clock signal and chip select signals operating a serial output type AD converter can be supplied from the output port under control of the processor, and external circuits can be configured only with a serial output type AD converter and external circuits thereof, thus permitting reduction of the hardware circuit configuration and cost reduction when using an AD converter.

It is also possible to check up whether or not the start bit preceding the converting operation of the AD converter and the stop bit at the end of converting operation are on proper levels. Malfunction, if any, can be recognized from an abnormality in the start bit or the stop bit, this permitting appropriate retry processing of error processing, thus improving reliability of AD-converted data.

Furthermore, dynamic properties of the AD converter can easily be changed by altering the clock signal period or the clock width through simple software change in the period of the interruption timer of the processor, thus allowing free setting of conversion characteristics in response to the analog signal to be converted.

In the above-mentioned embodiments, processing by a microprocessor unit (MPU) has been taken as an example. It is however needless to mention that a digital signal processor (DSP) may well be used. A shift register may be provided at the input port 16 in place of the counter register 32, to read in serial bit output from the AD converter for conversion into parallel data, and transfer same via a bus 34 to MPU 18.

In the above-mentioned embodiments, cases of control by a single AD converter 10 have been described. A plurality of AD converters 10 may commonly be controlled by the AD conversion control section 22 of MPU 18. Control of a plurality of AD converters may be based on parallel operation at a time of multiple AD converters at the same timing or on sequential operation of multiple AD converters in compliance with a prescribed sequence. The present invention is not limited to numerical values shown in the embodiments.

What is claimed is:

1. A control apparatus which comprises:

a serial output type AD converter which, in a state in which a chip select signal is valid, converts an entered analog signal into a bit in a digital signal of a prescribed number of bits, each time a clock signal is received in compliance with a prescribed bit sequence, and outputs one bit converted for each run of conversion as a bit data, said serial output type AD converter connected directly to a conductor providing said analog signal without utilizing a sample-and-hold circuit, each bit of the digital signal generated in response to the clock signal and the analog signal provided by said conductor at the time of receiving the clock signal;

a clock generating circuit which generates a clock signal to be supplied to said AD converter;

a chip select generating circuit which generates a clock signal to be supplied to said AD converter;

a register which stores bit data output from said AD converter;

an interruption timer which generates an interruption signal at prescribed intervals over a control period of said AD converter; and a control section which sets said clock generating circuit alternately in an L-level output condition and an H-level output condition each time an interruption signal is received from said interruption timer to generate a clock signal, generates a chip select signal from said chip select generating circuit in synchronization with an output of a first clock signal; and incorporates bit data output from said AD converter in synchronization with generation of said clock signal bit by bit to store in said register.

2. An apparatus according to claim 1, wherein:

said AD converter outputs a start bit on a prescribed level preceding the leading bit of said bit data, and at the same time, a stop bit on a level different from that of said start bit, following the final bit of said bit data; and said control section determines whether or not said start bit output by said AD converter is on a prescribed level, prior to reading said bit data into said register, and if not on the prescribed level, determines the status as an error.

3. An apparatus according to claim 2, wherein:

said control section determines, after the end of read-in of said bit data into said register, whether or not said stop bit output by said AD converter is on a prescribed level, and if the prescribed level is not met, make an error determination.

4. An apparatus according to claim 3, wherein:

said control section determines, upon error determination of said stop bit, whether or not said stop bit is on the prescribed level by performing retries of outputting the clock signal again, and make an error determination only when the prescribed level is not met even after multiple runs of retry.

5. An apparatus according to claim 2, wherein:

said control section determines, upon error determination of said start bit, whether or not said start bit is on the prescribed level by performing retries of outputting the clock signal again, and make an error determination only when the prescribed level is not met even after multiple runs of retry.

6. An apparatus according to claim 1, wherein:

said interruption timer has a variable timer period.

7. An apparatus according to claim 6, wherein:

said interruption timer makes the timer period variable in the middle of AD converting operation of said AD converter.

8. An apparatus according to claim 1, wherein:

said control section incorporates, after setting an L-level output condition for said clock generating circuit, bit data output by said AD converter into said register.

9. An apparatus according to claim 1, wherein:

said control section incorporates, after setting an H-level output condition for said clock generating circuit, bit data output by said AD converter into said register.

10. An apparatus according to claim 1, wherein:

said register, said interruption timer and said control section are achieved under program control by the processor; said clock generating circuit and said chip select circuit are provided on said output port of said processor; and said bit data output by said AD converter is incorporated from the input port of said processor into said register.

11. An apparatus according to claim 1, wherein:

said clock generating circuit and said chip select circuit are flip-flop circuits set or reset by an instruction of said processor.

12. An apparatus according to claim 1, wherein:

said AD converter converts a detection signal output from an analog sensor into a digital signal.

13. A control method of a serial output type AD converter, which comprises the steps of converting, in a state in which a chip select signal is valid, an analog signal into one bit of a series of bits of a digital signal of a prescribed number of bits each time a clock signal is received, and outputting a bit as bit data in compliance with a prescribed bit sequence for each run of conversion, which comprises the steps of:

generating an interruption signal at prescribed time intervals over a control period of said AD converter;

generating a clock signal by setting alternately an L-level output condition and an H-level output condition each time said interruption signal is received and outputting said clock signal to said AD converter;

outputting a chip select signal to said AD converter in synchronization with a first output of said clock signal; and incorporating said bit data output from said AD converter in synchronization with occurrence of said clock signal by said interruption signal, bit by bit sequentially into the register;

wherein, said serial output type AD converter is connected directly to a conductor providing said analog signal without utilizing a sample-and-hold circuit, each bit of the digital signal being generated in response to the clock signal and the analog signal provided by said conductor at the time of receiving the clock signal.

14. A method according to claim 13, wherein:

it is checked up whether or not the start bit output by said AD converter prior to the leading bit of said data bits is on a prescribed level, and if the prescribed level is not met, the status is determined as an error.

15. A method according to claim 14, wherein:

it is checked up, upon error determination of said start bit, whether or not the start bit is on the prescribed level through retries of outputting a clock signal again, and the status is determined as an error when the prescribed level is not met even after multiple runs of retry.

16. A method according to claim 13, wherein:

it is checked up whether or not the stop bit output by said AD converter following the final bit of said bit data is on a prescribed level, and it the prescribed level is not met, the status is determined as an error.

17. A method according to claim 16, wherein:

it is checked up, upon error determination of said stop bit, whether or not the stop bit is on the prescribed level through retires of outputting an clock signal again, and the status is determined as an error when the prescribed level is not met ;even after multiple runs of retry.

18. A method according to claim 13, wherein:

the bit data output by said AD converter is incorporated into said register after setting said clock signal to an L-level output condition in synchronization with said interruption signal.

19. A method according to claim 13, wherein:

the bit data output by said AD converter is incorporated into said register after setting said clock signal to an H-level output condition in synchronization with said interruption signal.

20. A method according to claim 13, wherein:

the period of occurrence of said interruption signal is made variable.

21. A control apparatus which comprises:

a serial output type AD converter which, in a state in which a chip select signal is valid, converts an entered analog signal into a series of bits of a digital signal of a prescribed number of bits, each bit of the series of the digital signal generated and output sequentially and generated and output separately in response to the receipt of a separate clock signal, said serial output type AD converter connected directly to a conductor providing said analog signal without utilizing a sample-and-hold circuit, each bit of the digital signal generated in response to the clock signal and the analog signal provided by said conductor at the time of receiving the clock signal;

a clock generating circuit which generates a clock signal to be supplied to said AD converter;

a chip select generating circuit which generates a clock signal to be supplied to said AD converter;

a register which stores bit data output from said AD converter;

an interruption timer which generates an interruption signal at prescribed intervals over a control period of said AD converter; and a control section which sets said clock generating circuit alternately in an L-level output condition and an H-level output condition each time an interruption signal is received from said interruption timer to generate a clock signal, generates a chip select signal from said chip select generating circuit in synchronization with an output of a first clock signal, and stores bit data output from said AD converter in synchronization with generation of said clock signal bit by bit in said register.

* * * * *